(12) United States Patent
Zeidman

(10) Patent No.: US 8,380,481 B2
(45) Date of Patent: *Feb. 19, 2013

(54) CONVEYING DATA FROM A HARDWARE DEVICE TO A CIRCUIT SIMULATION

(75) Inventor: Robert Marc Zeidman, Cupertino, CA (US)

(73) Assignee: Ionipas Transfer Company, LLC, Dover, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 13/487,750

(22) Filed: Jun. 4, 2012

(65) Prior Publication Data

US 2012/0245916 A1 Sep. 27, 2012

Related U.S. Application Data

(63) Continuation of application No. 12/946,721, filed on Nov. 15, 2010, now Pat. No. 8,195,442, which is a continuation of application No. 11/557,064, filed on Nov. 6, 2006, now Pat. No. 7,835,897, which is a continuation of application No. 10/158,648, filed on
(Continued)

(51) Int. Cl.
*G06F 17/50* (2006.01)

(52) U.S. Cl. ........... 703/14; 703/13; 703/15; 703/20; 703/21; 370/353; 370/352; 370/349; 709/200; 709/228

(58) Field of Classification Search .......... 703/13, 703/14, 15, 20, 21; 370/353, 352, 349; 709/200, 709/228
See application file for complete search history.

(56) References Cited

U.S. PATENT DOCUMENTS

| | | | |
|---|---|---|---|
| 4,486,877 A | 12/1984 | Turner | |
| 4,590,581 A | 5/1986 | Widdoes, Jr. | |
| 4,635,218 A | 1/1987 | Widdoes, Jr. | |
| 4,744,084 A | 5/1988 | Beck et al. | |
| 4,907,225 A | 3/1990 | Gulick et al. | |
| 4,908,819 A | 3/1990 | Casady et al. | |
| 4,939,507 A | 7/1990 | Beard et al. | |
| 5,048,012 A | 9/1991 | Gulick et al. | |
| 5,272,728 A | 12/1993 | Ogawa | |
| 5,280,481 A | 1/1994 | Chang et al. | |
| 5,299,313 A | 3/1994 | Petersen et al. | |
| 5,299,314 A | 3/1994 | Gates | |
| 5,303,347 A | 4/1994 | Gagne et al. | |
| 5,307,459 A | 4/1994 | Petersen et al. | |
| 5,347,305 A | 9/1994 | Bush et al. | |
| 5,353,412 A | 10/1994 | Douglas et al. | |
| 5,361,363 A | 11/1994 | Wells et al. | |
| 5,477,531 A | 12/1995 | McKee et al. | |
| 5,479,355 A | 12/1995 | Hyduke | |
| 5,497,498 A | 3/1996 | Taylor | |
| 5,539,452 A | 7/1996 | Bush et al. | |

(Continued)

OTHER PUBLICATIONS

Wen-Tsuen Chen, Yao-Wen Deng, Chuan-Pwu Wang, Nen-Fu Haung, Hwa-Chun Lin, Chung-Chin Lu and Ruay Chiung Chang, "On the Design of a High-Performance ATM Bridge", IEEE, 1998, pp. 207-213.

(Continued)

*Primary Examiner* — Kamini S Shah
*Assistant Examiner* — Cuong Luu

(57) ABSTRACT

A system and method is described for connecting a logic circuit simulation to a hardware peripheral that includes a computer running software for communicating data to and from the hardware peripheral. The software transmits the data received from the hardware peripheral to the device being simulated by the logic circuit simulation. The computer also transmits the data received from the device being simulated by the electronic circuit simulation to the hardware peripheral. This allows the user to test the device being simulated using real hardware for input and output instead of simulated hardware.

19 Claims, 4 Drawing Sheets

Related U.S. Application Data

May 31, 2002, now Pat. No. Re. 42,227, which is a continuation-in-part of application No. 09/751,573, filed on Dec. 28, 2000, now Pat. No. 7,050,962.

(60) Provisional application No. 60/193,169, filed on Mar. 28, 2000.

U.S. PATENT DOCUMENTS

| Patent No. | Date | Inventor |
|---|---|---|
| 5,553,059 A | 9/1996 | Emerson et al. |
| 5,596,575 A | 1/1997 | Yang et al. |
| 5,659,684 A | 8/1997 | Giovannoni et al. |
| 5,663,900 A | 9/1997 | Bhandari et al. |
| 5,678,028 A | 10/1997 | Bershteyn et al. |
| 5,684,721 A | 11/1997 | Swoboda et al. |
| 5,734,858 A | 3/1998 | Patrick et al. |
| 5,740,448 A | 4/1998 | Gentry et al. |
| 5,748,806 A | 5/1998 | Gates |
| 5,748,875 A | 5/1998 | Tzori |
| 5,752,068 A | 5/1998 | Gilbert |
| 5,754,764 A | 5/1998 | Davis et al. |
| 5,761,486 A | 6/1998 | Watanabe et al. |
| 5,771,370 A | 6/1998 | Klein |
| 5,805,792 A | 9/1998 | Swoboda et al. |
| 5,822,520 A | 10/1998 | Parker |
| 5,838,919 A | 11/1998 | Schwaller et al. |
| 5,838,950 A | 11/1998 | Young et al. |
| 5,848,236 A | 12/1998 | Dearth et al. |
| 5,850,345 A | 12/1998 | Son |
| 5,857,109 A | 1/1999 | Taylor |
| 5,881,269 A | 3/1999 | Dobbelstein |
| 5,889,954 A | 3/1999 | Gessel et al. |
| 5,907,696 A | 5/1999 | Stilwell et al. |
| 5,911,059 A | 6/1999 | Profit, Jr. |
| 5,933,656 A | 8/1999 | Hansen |
| 5,938,732 A | 8/1999 | Lim et al. |
| 5,963,726 A | 10/1999 | Rust et al. |
| 6,014,651 A | 1/2000 | Crawford |
| 6,047,387 A | 4/2000 | Chang et al. |
| 6,061,767 A | 5/2000 | Kuo et al. |
| 6,067,585 A | 5/2000 | Hoang |
| 6,108,309 A | 8/2000 | Cohoe et al. |
| 6,128,673 A | 10/2000 | Aronson et al. |
| 6,141,689 A | 10/2000 | Yasrebi |
| 6,151,567 A | 11/2000 | Ames et al. |
| 6,173,377 B1 | 1/2001 | Yanai et al. |
| 6,202,044 B1 | 3/2001 | Tzori |
| 6,223,144 B1 | 4/2001 | Barnett et al. |
| 6,229,808 B1 | 5/2001 | Teich et al. |
| 6,230,114 B1 | 5/2001 | Hellestrand et al. |
| 6,243,833 B1 | 6/2001 | Hitchcock et al. |
| 6,263,302 B1 | 7/2001 | Hellestrand et al. |
| 6,279,122 B1 | 8/2001 | Hitchcock et al. |
| 6,279,146 B1 | 8/2001 | Evans et al. |
| 6,307,877 B1 | 10/2001 | Philips et al. |
| 6,324,492 B1 | 11/2001 | Rowe |
| 6,327,579 B1 | 12/2001 | Crawford |
| 6,333,940 B1 | 12/2001 | Baydar et al. |
| 6,345,242 B1 | 2/2002 | Dearth et al. |
| 6,347,388 B1 | 2/2002 | Hollander |
| 6,389,379 B1 | 5/2002 | Lin et al. |
| 6,405,145 B1 | 6/2002 | Rust et al. |
| 6,418,392 B1 | 7/2002 | Rust et al. |
| 6,536,029 B1 | 3/2003 | Boggs et al. |
| 6,560,641 B1 | 5/2003 | Powderly et al. |
| 6,563,796 B1 | 5/2003 | Saito |
| 6,563,816 B1 | 5/2003 | Nodoushani et al. |
| 6,571,205 B1 | 5/2003 | Doucet et al. |
| 6,584,436 B2 | 6/2003 | Hellestrand et al. |
| 6,597,727 B2 | 7/2003 | Philips et al. |
| 6,640,101 B1 | 10/2003 | Daniel |
| 6,691,301 B2 | 2/2004 | Bowen |
| 6,704,895 B1 | 3/2004 | Swoboda et al. |
| 6,751,583 B1 | 6/2004 | Clarke et al. |
| 6,757,367 B1 | 6/2004 | Nicol |
| 6,772,107 B1 | 8/2004 | La Cascia, Jr. et al. |
| 6,782,355 B1 | 8/2004 | Cook et al. |
| 6,785,873 B1 | 8/2004 | Tseng |
| 6,807,583 B2 | 10/2004 | Hrischuk et al. |
| 6,810,442 B1 | 10/2004 | Lin et al. |
| 6,850,510 B2 | 2/2005 | Kubler et al. |
| 6,850,577 B2 | 2/2005 | Li |
| 6,862,635 B1 | 3/2005 | Alverson et al. |
| 6,865,526 B1 | 3/2005 | Henkel et al. |
| 6,876,962 B2 | 4/2005 | Reblewski |
| 6,898,233 B2 | 5/2005 | Philips et al. |
| 6,904,110 B2 | 6/2005 | Trans et al. |
| 6,915,521 B1 | 7/2005 | Monteiro |
| 6,982,993 B1 | 1/2006 | Claveloux et al. |
| 7,050,962 B2 | 5/2006 | Zeidman |
| 7,076,418 B1 | 7/2006 | Mayer |
| 7,124,064 B1 | 10/2006 | Thurston |
| 7,200,544 B1 | 4/2007 | McCown |
| 7,209,470 B2 | 4/2007 | McGowan |
| 7,283,123 B2 | 10/2007 | Braun et al. |
| 2001/0038674 A1 | 11/2001 | Trans |
| 2001/0041566 A1 | 11/2001 | Xanthos et al. |
| 2001/0049594 A1 | 12/2001 | Klevans |
| 2002/0001088 A1 | 1/2002 | Wegmann et al. |
| 2002/0010881 A1 | 1/2002 | White |
| 2002/0018163 A1 | 2/2002 | Yamamoto et al. |
| 2002/0019969 A1 | 2/2002 | Hellestrand et al. |
| 2002/0032559 A1 | 3/2002 | Hellestrand et al. |
| 2002/0056358 A1 | 5/2002 | Ludwig |
| 2002/0067757 A1 | 6/2002 | Philips et al. |
| 2002/0095224 A1 | 7/2002 | Braun et al. |
| 2002/0101824 A1 | 8/2002 | Ziedman |
| 2002/0127525 A1 | 9/2002 | Arington et al. |
| 2002/0138244 A1 | 9/2002 | Meyer |
| 2002/0181633 A1 | 12/2002 | Trans |
| 2003/0033588 A1 | 2/2003 | Alexander |
| 2003/0033594 A1 | 2/2003 | Bowen |
| 2003/0040897 A1 | 2/2003 | Murphy et al. |
| 2003/0043753 A1 | 3/2003 | Nelson et al. |
| 2003/0086426 A1 | 5/2003 | Vandeweerd et al. |
| 2003/0093257 A1 | 5/2003 | Cavanagh et al. |
| 2003/0093569 A1 | 5/2003 | Sivier et al. |
| 2003/0101040 A1 | 5/2003 | Nightingale |
| 2003/0126195 A1 | 7/2003 | Reynolds et al. |
| 2003/0137528 A1 | 7/2003 | Wasserman et al. |
| 2003/0225556 A1 | 12/2003 | Zeidman |
| 2003/0225564 A1 | 12/2003 | Zeidman |
| 2004/0034719 A1 | 2/2004 | Peterson et al. |
| 2004/0095398 A1 | 5/2004 | Muratori et al. |
| 2004/0143655 A1 | 7/2004 | Narad et al. |
| 2004/0148610 A1 | 7/2004 | Tsun et al. |
| 2004/0208293 A1 | 10/2004 | Mohammadian et al. |
| 2005/0026649 A1 | 2/2005 | Zicker et al. |
| 2005/0102125 A1 | 5/2005 | Tseng |
| 2006/0059387 A1 | 3/2006 | Swoboda et al. |
| 2006/0179427 A1 | 8/2006 | Underseth et al. |
| 2006/0259949 A1 | 11/2006 | Schaefer et al. |
| 2007/0061127 A1 | 3/2007 | Zeidman |
| 2007/0064694 A1 | 3/2007 | Ziedman |
| 2007/0067151 A1 | 3/2007 | Fiedler et al. |
| 2007/0100598 A1 | 5/2007 | Zeidman |
| 2008/0058005 A1 | 3/2008 | Zicker et al. |

OTHER PUBLICATIONS

Microsoft Corporation, "Direct Cable Connection, Using Direct Cable Connection to Connect to Another Computer," 2000, 2 pages.

Laplink 2000, "Complete Access to Your PC From Anywhere," www.laplink.com, 2 pages.

Mark D. Hill and Shubhendu S. Mukherjee, "The Impact of Data Transfer and Buffering Alternatives on Network Interface Design," Proceedings of the Fourth International Symposium on High-Performance Computer Architecture, Feb. 1998, 12 pages.

D. Helmy, B. Pagurek, A.R. Kaye, "Knowledge Based Fault Location in a Data Communication Network," CH2538-7/88/0000-1729, IEEE, 1988, pp. 1729-1733.

Microsoft Press Computer Dictionary, Microsoft Press, Third Edition, 1997, pp. 179-180.

Wesley W. Chu and M. Y. Elsanadidi, "Simulation Studies of the Behavior of Multihop Broadcast Networks," ACM 0-89791-089-3/83/0300-0170, 1983, pp. 170-177.

T.V. Larkshman, et al., "The Performance of TCP/IP for Networks with High Bandwidth-Delay Products and Random Loss," IEEE/ACM Transactions on Networking, vol. 5, No. 3, Jun. 1997, pp. 336-350.

Chen, et al., "On the Design of a High-Performance ATM Bridge," IEEE, 0/7803-4982-2/98, 1998, pp. 207-213.

Dean, et al., "A High-Temperature Embedded Network Interface using Software Thread Integration," Second International Workshop on Compiler and Architecture Support for Embedded Systems, Oct. 1-3, 1999, 5 pages.

Seungjun Lee, "A Hardware-Software Co-Simulation Environment," University of California at Berkeley, 1993, 195 pages.

Office Action in U.S. Appl. No. 10/158,648 issued Oct. 5, 2005, 15 pages.

Response to Office Action in U.S. Appl. No. 10/158,648 issued Oct. 5, 2005, mailed Dec. 21, 2005, 23 pages.

Office Action in U.S. Appl. No. 10/158,648 issued Apr. 10, 2006, 14 pages.

Response to Office Action in U.S. Appl. No. 10/158,648 issued Apr. 10, 2006, mailed Jun. 26, 2006, 23 pages.

Office Action in U.S. Appl. No. 10/158,648 issued Dec. 4, 2006, 5 pages.

Pre-Appeal Brief Request for Review in U.S. Appl. No. 10/158,648 issued Feb. 27, 2007, 7 pages.

Office Action in U.S. Appl. No. 10/158,648 issued Dec. 4, 2006, mailed Jun. 27, 2007, 25 pages.

Office Action in U.S. Appl. No. 11/557,064 issued Jul. 27, 2007, 20 pages.

Response to Office Action in U.S. Appl. No. 11/557,064 issued Jul. 27, 2007, mailed Sep. 19, 2007, 24 pages.

Office Action in U.S. Appl. No. 11/557,064 issued Oct. 19, 2007, 20 pages.

Response to Office Action in U.S. Appl. No. 11/557,064 issued Oct. 19, 2007, mailed Dec. 12, 2007, 11 pages.

Office Action in U.S. Appl. No. 11/557,064 issued Jan. 15, 2008, 40 pages.

Response to Office Action in U.S. Appl. No. 11/557,064 issued Jan. 15, 2008, mailed May 15, 2008, 14 pages.

Office Action in U.S. Appl. No. 11/557,064 issued Oct. 14, 2008, 18 pages.

Response to Office Action in U.S. Appl. No. 11/557,064 issued Oct. 14, 2008, mailed Jan. 14, 2009, 18 pages.

Office Action in U.S. Appl. No. 12/946,721 issued Jul. 20, 2011, 11 pages.

Response to Office Action in U.S. Appl. No. 12/946,721 issued Jul. 20, 2011, mailed Oct. 19, 2011, 10 pages.

CONVEYING DATA FROM A HARDWARE DEVICE TO A CIRCUIT SIMULATION

CROSS-REFERENCE TO RELATED APPLICATIONS

The present application is a continuation of U.S. application Ser. No. 12/946,721, filed Nov. 15, 2010 (now U.S. Pat. No. 8,195,442), which is a continuation of U.S. application Ser. No. 11/557,064, filed Nov. 6, 2006 (now U.S. Pat. No. 7,835,897), which is a continuation of U.S. application Ser. No. 10/158,648, filed May 31, 2002 (originally issued as U.S. Pat. No. 7,226,490; later reissued as U.S. Pat. No. RE42,227 from U.S. application Ser. No. 12/481,943), which is a continuation-in-part of U.S. application Ser. No. 09/751,573, filed Dec. 28, 2000, now U.S. Pat. No. 7,050,962, which claims the benefit of provisional application 60/193,169 filed on Mar. 28, 2000. The disclosures of each of the above-referenced applications are incorporated by reference herein in their entireties.

BACKGROUND OF THE INVENTION

Prior to reducing an integrated circuit design to a form suitable for fabrication, the integrated circuit design is often simulated in software on a computer to allow the design to be optimized and debugged. Typically, using a hardware description language (e.g., Verilog), the circuit designer prepares a description of the integrated circuit, which is then compiled into a software model to be simulated on the computes (e.g., an engineering workstation).

When an integrated circuit that connects to peripheral hardware, such as an LCD display or a Universal Serial Bus (USB) port, is simulated, the peripheral hardware is modeled in the hardware description language and communication with the peripheral hardware is also simulated. However, such a model of the peripheral hardware does not behave completely accurately and correctly. There are often logical, electrical, or timing differences between the simulation model and the physical peripheral hardware. When the integrated circuit is manufactured and connected to the actual peripheral hardware, these problems will become apparent and the integrated circuit will often need to be redesigned to compensate for them.

SUMMARY OF THE INVENTION

The present invention allows a logic circuit simulator running on a host computer (e.g., a personal computer) and simulating a circuit ("simulated device") to connect to a physical peripheral hardware device. The present invention provides a method and an apparatus for transferring data between a circuit simulation and the peripheral hardware device. In one embodiment, an interface software program also installed on said host computer is provided to handle communication between the operating system drivers for the peripheral hardware device and the simulated device. The peripheral hardware device can be, for example, a computer display monitor.

According to the present invention, data sent to a simulated device from a physical peripheral hardware device is received by the interface software and stored in buffers in the existing memory in the host computer. Said interface software in said host computer repackages the data into a second format for transmission to said simulated device. In one embodiment, the data from said physical peripheral hardware device is sent to the operating system of said host computer. Said interface software intercepts said data and examines it. If said data is intended for said simulated device, said interface software loads it into said data buffers, subsequently repackages said data into a second format for transmission to said simulated device and sends said repackaged data to the simulated device. If said data from said physical peripheral hardware device is not intended for said simulated device, said interface software program sends said data on to said host computer operating system.

Similarly, the interface software in the host computer repackages data received from the simulated device into proper format for transmission to the physical peripheral hardware device. Under this arrangement, the existing memory in the host computer is used to buffer data communicated between said simulated device and said physical peripheral hardware device. In one embodiment, the data from said simulated device is sent to the interface software program. If said data is intended for said physical peripheral hardware device, said interface software program repackages said data and sends said data to said host computer operating system for transmission to said physical peripheral hardware device. Said operating system is notified that said data is intended for said physical peripheral hardware device because said interface software program uses a specific application program interface (API) of the operating system used specifically to access said physical peripheral hardware device.

In one embodiment, the interface software of the host computer is implemented as a multithread program including four executing threads. One thread is a task that receives data from the physical peripheral hardware device and stores said received data in a first buffer. A second thread is a task that polls said first buffer for said received data. This second thread repackages said received data and sends said repackaged data via the simulation interface to the simulated device. A third thread is a task that receives data from said simulated device via said simulation interface and stores said received data in a second buffer. A fourth thread is a task that polls said second buffer for said data received from said simulated device. Said fourth thread repackages said data received from said simulated device and sends said repackaged data to said physical peripheral hardware device using an API of the operating system software of said host computer.

In another embodiment, the interface software of the host computer is implemented as a multithread program, as in the previous embodiment, except that the second buffer is eliminated and the third and fourth threads are combined into a single thread. In this embodiment, the tasks of the single thread receive data from the simulated device via the simulation interface, repackages said received data and sends said repackaged to said physical peripheral hardware device using an API of the operating system software of said host computer. This approach is possible because a circuit simulation runs at a much slower speed than the physical peripheral hardware device, such that data received from the simulated device can be repackaged and sent to the physical peripheral hardware device before the next data packet's arrival from the circuit simulation.

In yet another embodiment, the interface software of the host computer is implemented as a multithreaded program having, in one instance, two executing threads. One thread is a task that receives data from the physical peripheral hardware device, stores said received data in a buffer, retrieves said stored data for repackaging, and sends said repackaged data via a simulation interface to the simulated device. Another thread is a task that receives data from said simulated device via said simulation interface from said simulated device, repackages said data and sends said repackaged data to said physical peripheral hardware device using an API of the operating system software of said host computer.

Further features and advantages of various embodiments of the invention are described in the detailed description below, which is given by way of example only.

BRIEF DESCRIPTION OF THE DRAWINGS

The present invention will be understood more fully from the detailed description given below and from the accompanying drawings of the preferred embodiment of the invention, which, however, should not be taken to limit the invention to the specific embodiment but are for explanation and understanding only.

In the following detailed description, to simplify the description, like elements are provided like reference numerals.

DETAILED DESCRIPTION

Software that allows a logic circuit simulator running on a host computer (e.g., a personal computer) and simulating a circuit ("simulated device") to connect to a physical peripheral hardware device is described. In the following description, numerous specific details are set forth, such as the peripheral interface, the operating system, the type of computer, etc., in order to provide a thorough understanding of the present invention. It will be obvious, however, to one skilled in the art that these specific details need not be used to practice the present invention. In other instances, well known structures, functions, and software programs have not been shown in detail in order not to unnecessarily obscure the present invention.

Figure 1:
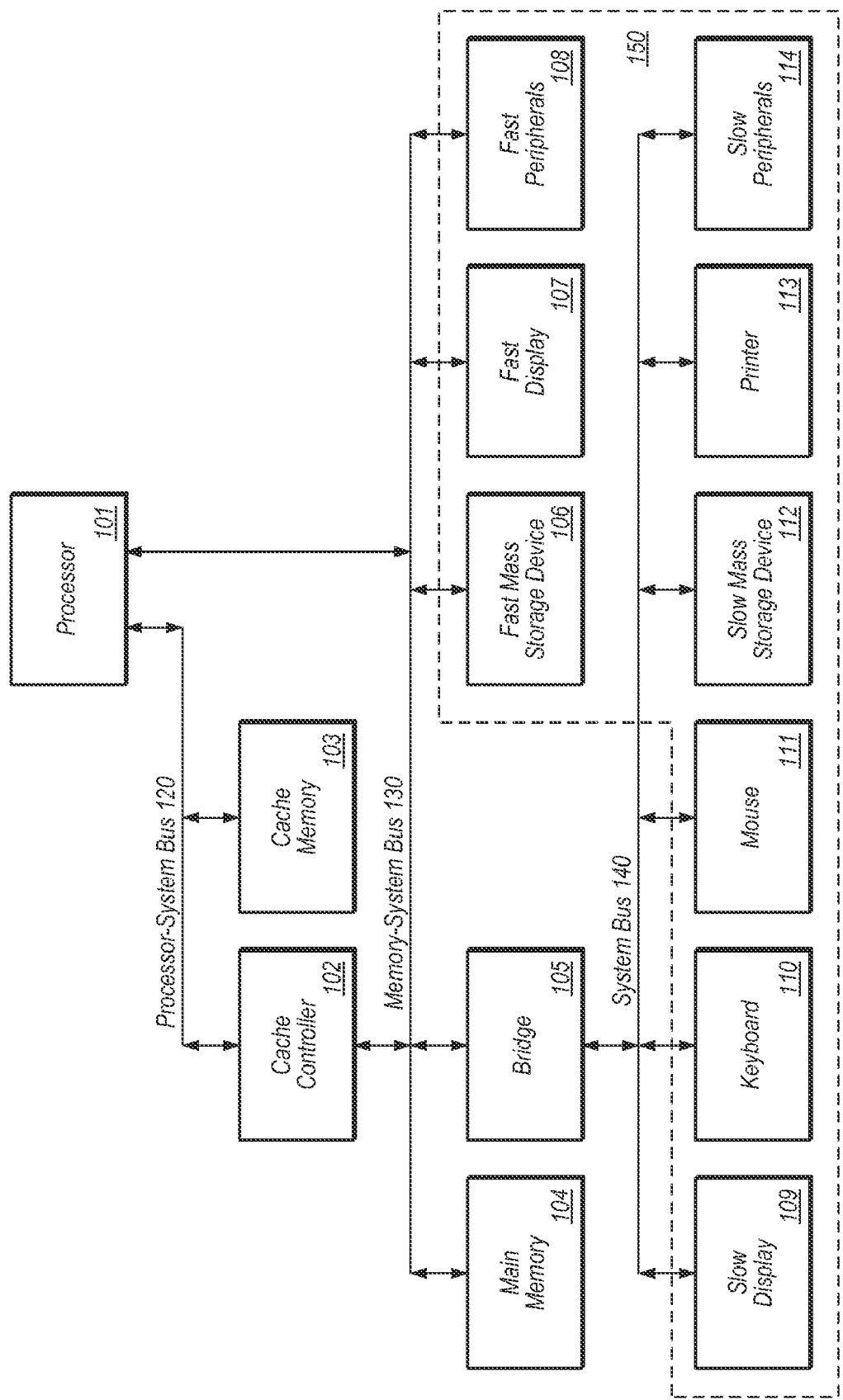
FIG. 1 shows a computer with various hardware peripherals including built-in peripherals and external peripherals.

FIG. 1 shows a typical computer configuration that implements the present invention. The processor 101 connects via high-speed processor-system bus 120 to the cache controller 102 and the cache memory 103. Said cache controller 102 connects via a medium speed memory-system bus 130 to main memory 104 and bridge 105 as well as to high speed peripheral devices such as fast mass storage device 106, fast display 107, and other fast peripherals 108. Note that said processor 101 also connects directly via medium speed memory-system bus 130 to said high speed peripherals fast mass storage device 106, fast display 107, and other fast peripherals 108. Said bridge 105 acts to connect the medium speed memory-system bus 130 to low-speed system bus 140 which connects to slow peripherals slow display 109, keyboard 110, mouse 111, slow mass storage device 112, printer 113, and slow peripherals 114. All peripherals, fast or slow, are shown in shaded box 150. Note that peripherals may in fact be boards or chips that drive peripheral devices, but for the purposes of this invention, we do not differentiate between the chips or board that drives a peripheral and the peripheral itself.

Figure 2:
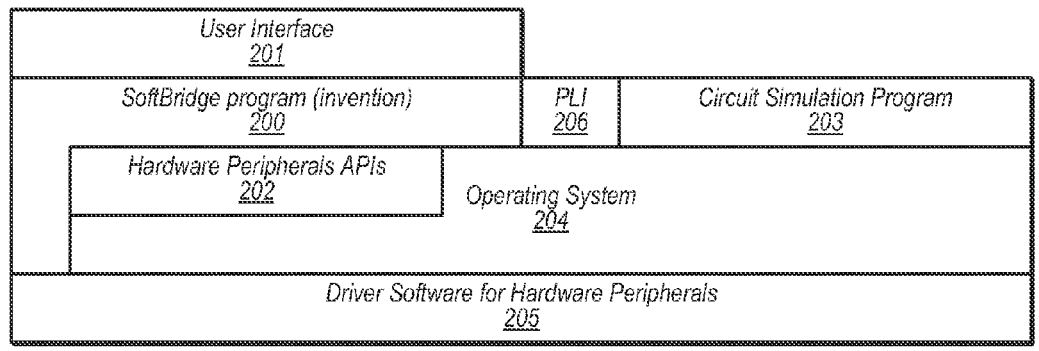
FIG. 2 shows a block diagram of typical computer software including low-level hardware drivers, an operating system, application programs, and a user interface.

FIG. 2 shows a block diagram of the software executing on processor 101. At the lowest level is the driver software for hardware peripherals 205. This software, usually supplied by the manufacturer of said peripherals allows computer operating system software 204 to access said peripherals without detailed knowledge of the hardware design or the operation of said peripherals. Said operating system also includes routines called hardware peripheral application program interfaces (APIs) 202 that allow application programs to indirectly access the hardware peripherals via said operating system. In this way, application programs can control the peripherals but the operating system can override said control or can allocate these peripherals to application programs according to particular priorities.

A circuit simulation program 203 runs at a higher level than the operating system and uses the operating system to communicate with the user to display information via a peripheral such as a monitor or a printer. Said simulation program also uses the operating system to get information from a user via the mouse or keyboard. The operating system 204 also allows said simulation 203 and other applications to be running simultaneously and allocates time and resources to all applications according to set priorities.

One embodiment of the invention is shown as SoftBridge program 200, an application program that runs on top of the operating system, which controls the computer resources allocated to it. The SoftBridge program 200 can communicate to the simulation 203 via a software interface called a programming language interface (PLI) 206.

Note that the SoftBridge program 200 can use the hardware peripheral APIs 202 to access the hardware peripherals indirectly. In some cases, to increase performance for example, it may be necessary for the SoftBridge program 200 to access the driver software 205 directly, bypassing the operating system 204 and the APIs provided by the operating system.

The user interface 201 is the part of the SoftBridge program 200 that allows the human user to enter information and control operation of the program 200. Said user interface 201 also gives results back to the human user.

In prior art, a circuit simulation of a device that drives a hardware peripheral would output raw data. An engineer would then look over the data and compare it manually to a specification for said hardware peripheral to determine whether the data is correct. This manual checking of data is a time consuming operation that is prone to human error and limits the amount of simulation that can be run because time in the development process must be allocated for humans to check the results. Another prior art method is to create a circuit simulation of the hardware peripheral ("simulated peripheral") and have the simulated device drive the simulated peripheral and observe that the correct behavior occurs. This method requires that an engineer write a model for said hardware peripheral. Not only does this take time to develop said model, but the model itself is prone to human error because it may not be completely correct and may thus not accurately model the true behavior of the peripheral hardware. Because the circuit simulation software must now simulate not only the device that drives the software but also the peripheral hardware device being driven, the simulation software runs much slower.

In prior art, a simulated device that receives data from a hardware peripheral would need to have raw data written by an engineer and then used by the simulation software as stimuli for the device. This manual creation of data is a time consuming operation that is prone to human error and limits the amount of simulation that can be run because time in the development process must be allocated for humans to create the data. Another prior art method is to create a circuit simulation of the hardware peripheral and have the simulated peripheral drive the simulated device and observe that the behavior is correct. This method requires that an engineer write a model for the hardware peripheral. Not only does this take time to develop said model, but the model itself is prone to human error because it may not be completely correct and may thus not accurately model the true behavior of the peripheral hardware. Because the circuit simulation software must now simulate not only the device that drives the software but also the peripheral hardware device being driven, the simulation software runs much slower.

In other prior art, a hardware peripheral device is connected, pin by pin, to another hardware peripheral device called a hardware modeler interface, which is in turn connected to a host computer. Said host computer runs a circuit simulation of a device. Whenever said simulated device intends to stimulate said hardware peripheral, said simulation software notifies special hardware modeling software, which forces said hardware modeler interface to assert or deassert signals to said hardware peripheral according to the simulated device outputs. Similarly, whenever said hardware peripheral outputs change, said signals are sent to said hardware modeler interface, which notifies said hardware modeling software, which in turn notifies said simulation software, which stimulates said simulated device. This method requires very specialized software, the hardware modeling software, to interface between the simulation software and the hardware modeler interface. This hardware modeling software must continually be rewritten to be compatible with new operating systems, new host computers, or new simulation software. The hardware modeler interface is a costly, specialized piece of hardware that must physically be connected to the hardware peripheral. Said hardware modeler interface is limited to connecting to certain hardware peripheral devices by the type and size of the connectors that it has available. For example, to connect to an ISA card, said hardware modeler interface must have an ISA connector and to connect to a PCI card, said hardware modeler interface must have a PCI connector. To be able to connect to any kind of peripheral device would require said hardware modeler interface to comprise an extremely large circuit board with dozens of connectors, or consist of dozens of different boards for connecting to different peripheral hardware devices.

Figure 3:
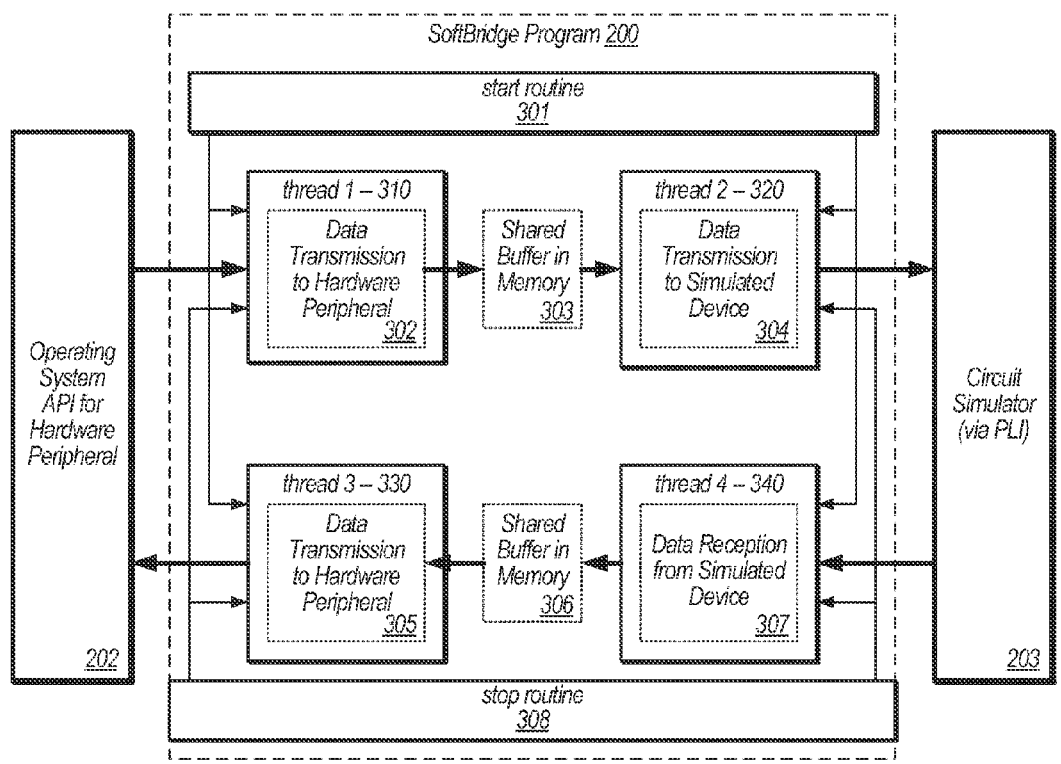
FIG. 3 is a block diagram showing the functions performed by SoftBridge program 200, in accordance with one embodiment of the present invention.

The present invention overcomes the limitations of the prior art by interfacing a real hardware peripheral to the circuit simulation of said device, taking advantage of standard software that is easily available and has already been fully tested. This standard software includes driver software and APIs that are written by the hardware peripheral manufacturer and are included in most standard operating systems. As shown in FIG. 3, data from the circuit simulation 203 of said device that is intended to drive said hardware peripheral is sent to the SoftBridge program 200 from the circuit simulation program PLI. The SoftBridge program 200 sends said data to the hardware peripheral either via the hardware peripheral API 202 of the operating system or directly to the hardware peripheral device drivers 205. Data from the hardware peripherals is retrieved by the SoftBridge program 200 either from the hardware peripheral API 202 of the operating system or directly from the hardware peripheral device drivers 205. The SoftBridge program 200 sends said data to the circuit simulation 203 via the circuit simulation program PLI.

FIG. 3 shows a block diagram of the SoftBridge program. In this embodiment, the SoftBridge program 200 has a start routine 301 that initiates the program and begins execution upon input from the user. Said start routine initializes four independent threads that run simultaneously, thread 1 (310), thread 2 (320), thread 3 (330), and thread 4 (340). Thread 1 consists of a data reception routine 302 that receives data from the hardware peripheral either via the operating system API 202 or directly from the hardware drivers. Said data reception routine 302 may obtain said data by polling the hardware or alternatively via an interrupt mechanism that signals the thread whenever data is available from said hardware. Said data reception software routine 302 receives said data and stores it in a shared memory buffer 303. Thread 2 consists of data transmission routine 304 that polls said shared buffer 303. When data is available in said shared buffer 303, said data transmission routine 304 retrieves said data. If necessary, data transmission routine 304 modifies said data to be acceptable to the circuit simulator 203. Data transmission routine 304 then transmits said data to said circuit simulator via a PLI.

Thread 4 consists of a data reception routine 307 that retrieves data from circuit simulator 203 via a PLI. Thread 4 may obtain said data by polling the circuit simulator or alternatively via an interrupt mechanism that signals the thread whenever data is available from said circuit simulator. Said data reception routine 307 stores said received data in shared memory buffer 306. Thread 3 consists of data transmission routine 305 that polls said shared buffer 306. When data is available in said shared buffer 306, said data reception routine 305 retrieves said data. If necessary, said data reception routine 305 modifies said data to be acceptable to the hardware peripheral. Said data reception routine 305 then transmits said data to said hardware peripheral either via the operating system API 202 or directly to the hardware drivers.

In this embodiment, the SoftBridge program 200 has a stop routine 308 that takes input from the user in order to stop all executing threads of the program.

Figure 4:
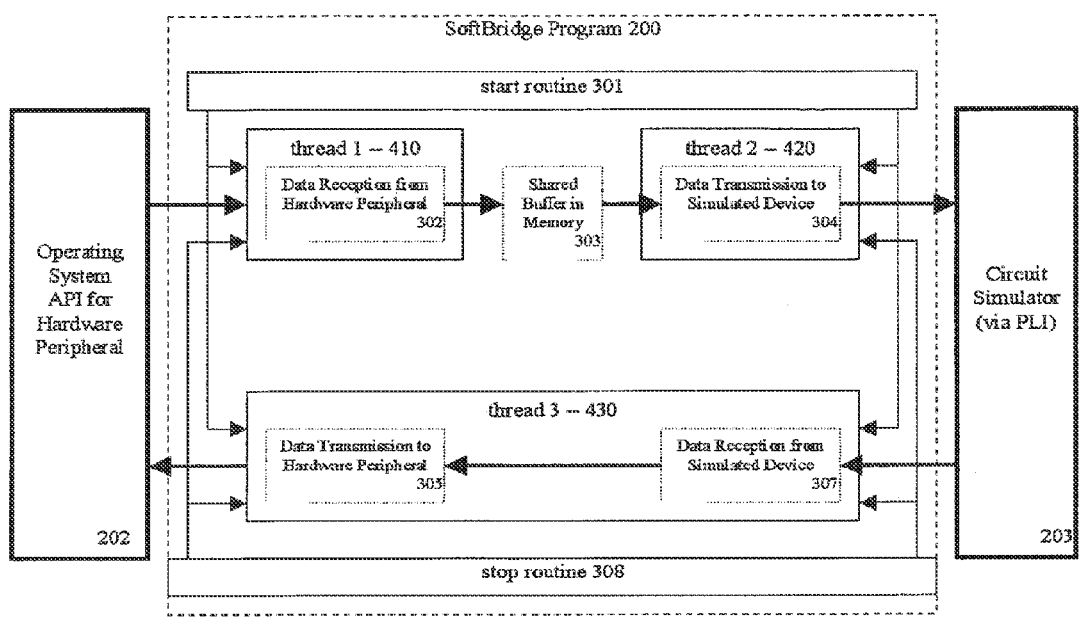
FIG. 4 is a block diagram showing the functions performed by SoftBridge program 200, in accordance with a second embodiment of the present invention.

FIG. 4 shows another embodiment of the SoftBridge program 200. In this embodiment, the SoftBridge program 200 has a start routine 301 that initiates the program and begins execution upon input from the user. Said start routine initializes three independent threads that run simultaneously, thread 1 (410), thread 2 (420), and thread 3 (430). Thread 1 consists of a data reception routine 302 that receives data from the hardware peripheral either via the operating system API 202 or directly from the hardware drivers. Said data reception routine 302 may obtain said data by polling the hardware or alternatively via an interrupt mechanism that signals the thread whenever data is available from said hardware. Said data reception software routine 302 receives said data and stores it in a shared memory buffer 303. Thread 2 consists of data transmission routine 304 that polls said shared buffer 303. When data is available in said shared buffer 303, said data transmission routine 304 retrieves said data. If necessary, data transmission routine 304 modifies said data to be acceptable to the circuit simulator 203. Data transmission routine 304 then transmits said data to said circuit simulator via a PLI.

Thread 3 consists of a data reception routine 307 that retrieves data from circuit simulator 203 via a PLI and a data transmission routine 305 that transmits said data to the hardware peripheral either via the operating system API 202 or directly to the hardware drivers. Thread 3 may obtain said data by polling the circuit simulator or alternatively via an interrupt mechanism that signals the thread whenever data is available from said circuit simulator. Said data reception routine 307 sends said received data to said data reception routine 305 that modifies said data to be acceptable to the hardware peripheral, if necessary, then transmits said data to said hardware peripheral either via the operating system API 202 or directly to the hardware drivers. This embodiment takes advantage of the fact that the circuit simulator 203 is running much slower than the software of the SoftBridge program 200 and that the hardware peripheral can receive data at a faster rate than the software can send it. Therefore there is only a single thread to retrieve data from the circuit simulator and send it to the hardware peripheral. In this embodiment, the SoftBridge program 200 can perform the entire operation of thread 3 without slowing down the circuit simulator or the hardware peripheral. Unlike the embodiment shown in FIG. 3, this embodiment does not need a shared memory buffer between data reception routine 307 and data transmission routine 305.

In this embodiment, the SoftBridge program 200 has a stop routine 308 that takes input from the user in order to stop all executing threads of the program.

Figure 5:
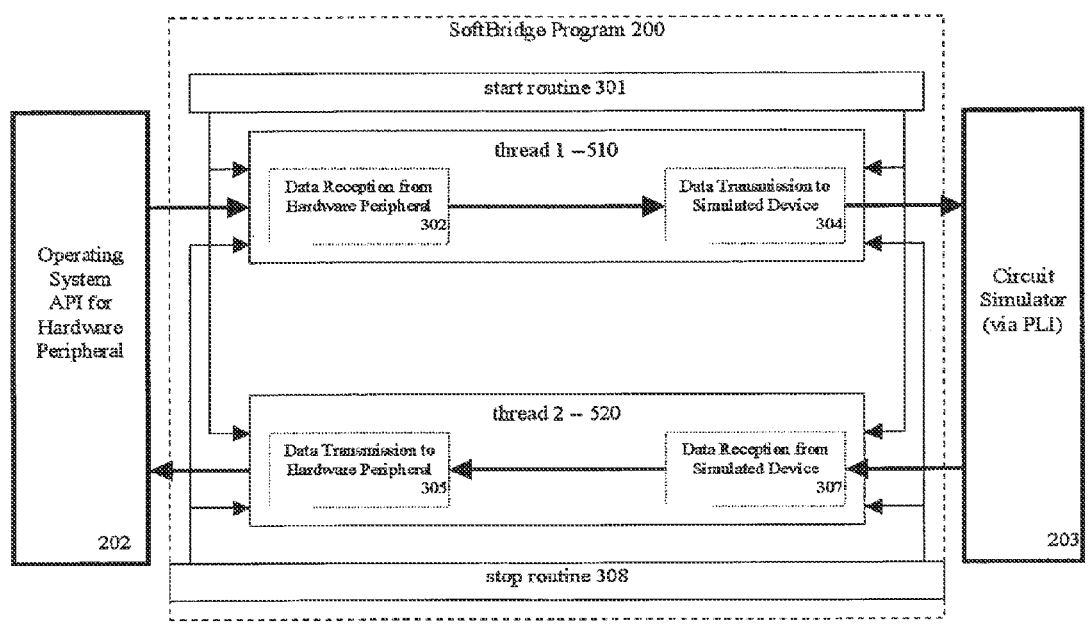
FIG. 5 is a block diagram showing the functions performed by SoftBridge program 200, in accordance with a third embodiment of the present invention.

FIG. 5 shows another embodiment of the SoftBridge program 200. In this embodiment, the SoftBridge program 200 has a start routine 301 that initiates the program and begins execution upon input from the user. Said start routine initializes two independent threads that run simultaneously, thread 1 (510), and thread 2 (520). Thread 1 consists of a data reception routine 302 and a data transmission routine 304. Data reception routine 302 receives data from the hardware peripheral either via the operating system API 202 or directly from the hardware drivers. Said data reception routine 302 may obtain said data by polling the hardware or alternatively via an interrupt mechanism that signals the thread whenever data is available from said hardware. Said data reception software routine 302 receives said data and sends it to said data transmission routine 304 that modifies said data to be acceptable to the circuit simulator 203, if necessary, then transmits it to said circuit simulator via a PLI. This embodiment takes advantage of the fact that the hardware peripheral sends data at a slower rate than the software of the SoftBridge program 200 can receive it. Therefore, there is only a single thread to retrieve data from the hardware peripheral and send it to the circuit simulator. In this embodiment, the SoftBridge program 200 can perform the entire operation of thread 1 without missing data from the hardware peripheral. Unlike the embodiment shown in FIG. 4, this embodiment does not need a shared memory buffer between data reception routine 302 and data transmission routine 304.

Thread 2 consists of a data reception routine 307 that retrieves data from circuit simulator 203 via a PLI and a data transmission routine 305 that transmits said data to the hardware peripheral either via the operating system API 202 or directly to the hardware drivers. Thread 2 may obtain said data by polling the circuit simulator or alternatively via an interrupt mechanism that signals the thread whenever data is available from said circuit simulator. Said data reception routine 307 sends said received data to said data reception routine 305 that modifies said data in order to be acceptable to the hardware peripheral, if necessary, then transmits said data to said hardware peripheral either via the operating system API 202 or directly to the hardware drivers.

In this embodiment, the SoftBridge program 200 has a stop routine 308 that takes input from the user in order to stop all executing threads of the program.

Various modifications and adaptations of the operations described here would be apparent to those skilled in the art based on the above disclosure. Many variations and modifications within the scope of the present SoftBridge program 200 are therefore possible. The present SoftBridge program 200 is set forth by the following claims.

I claim:

1. A method of conveying data to a circuit simulator program, comprising:
    receiving data at a computer system from a non-emulated peripheral device at a first rate;
    the computer system temporarily storing the received data in a buffer implemented in a memory of the computer system; and
    the computer system transferring at least a portion of the temporarily stored data to a circuit simulator program, wherein the circuit simulator program simulates an electronic device designed to interact with the non-emulated peripheral device, and wherein the transferring occurs at a second rate that is less than the first rate.

2. The method of claim 1, further comprising the computer system, prior to said transferring, repackaging the at least a portion of the temporarily stored data into a data format compatible with the circuit simulator program.

3. The method of claim 1, wherein electronics of the non-emulated peripheral device are configured to perform one or more functions of the non-emulated peripheral device in real-time, and wherein the simulated electronic device is designed to receive input generated by the one or more functions.

4. The method of claim 1, wherein a first thread of a program executing on the computer system receives the data from the non-emulated peripheral device; and
    wherein the method further comprises:
    a second thread of the program executing on the computer system receiving additional data from the circuit simulator program, wherein the additional data was transmitted responsive to transferring the at least a portion of the temporarily stored data to the circuit simulator program; and
    the second thread transmitting the additional data to the non-emulated peripheral device.

5. The method of claim 4, wherein for a given data packet received by the second thread from the circuit simulator program, the second thread transmits data from the data packet to the non-emulated peripheral device before the second thread receives a next data packet from the circuit simulator program.

6. The method of claim 1, wherein the non-emulated peripheral device operates in real-time and was not programmed with instructions by a party that is using the computer system to perform testing on the simulated electronic device.

7. The method of claim 1, wherein the circuit simulator program is executing on the computer system.

8. An article of manufacture comprising a non-transitory computer-readable storage medium having stored thereon instructions that are executable to cause the computer system to perform operations comprising:
    receiving data from a non-emulated peripheral device at a first rate;
    temporarily storing the received data in a buffer implemented in a memory of the computer system; and
    transferring at least a portion of the temporarily stored data to a circuit simulator program, wherein the circuit simulator program simulates an electronic device designed to interact with the non-emulated peripheral device, and wherein the transferring occurs at a second rate that is less than the first rate.

9. The article of manufacture of claim 8, wherein the non-emulated peripheral device is configured to perform one or more functions of the non-emulated peripheral device in real-time in order to produce output data, wherein the electronic device is designed to receive and operate on the produced output data, and wherein the non-emulated peripheral device is non-reprogrammable to cause at least one of the one or more functions to be performed differently.

10. The article of manufacture of claim 8, wherein the operations further comprise transferring the at least a portion of the temporarily stored data to the circuit simulator by bypassing an operating system of the computer system.

11. The article of manufacture of claim 8, wherein the operations further comprise:
   receiving user input data; and
   initiating a plurality of threads in response to the user input data, wherein the plurality of threads transfer data between the circuit simulator program and the non-emulated peripheral device.

12. The article of manufacture of claim 8, wherein the operations further comprise modifying the data received from the non-emulated peripheral device to a format acceptable to the circuit simulator program, wherein the data received from the non-emulated peripheral device is originally received in a different format.

13. A computer system, comprising:
   a processor;
   a peripheral connection interface; and
   a non-transitory computer-readable storage medium having instructions stored thereon that are executable by the processor to cause the computer system to perform operations comprising:
      receiving data via the peripheral connection interface from a non-emulated peripheral device, wherein the data is received at a first rate;
      creating a buffer in a memory of the computer system; temporarily storing the received data in the buffer; and
      transferring at least a portion of the temporarily stored data to a circuit simulator program, wherein the circuit simulator program simulates an electronic device designed to interact with the non-emulated peripheral device, wherein the transferring occurs at a second rate that is less than the first rate.

14. The computer system of claim 13, wherein the data is received in a first quantity over a first length of time;
   wherein the at least a portion of the data is transferred in a second quantity over a second length of time, wherein the second quantity is less than the first quantity; and
   wherein the second quantity divided by the second length of time yields the second rate that is less than the first rate.

15. The computer system of claim 13, wherein the operations further comprise receiving the data via device driver software for the non-emulated peripheral device that is running on the computer system.

16. The computer system of claim 15, wherein the device driver software is part of an operating system of the computer system.

17. The computer system of claim 13, wherein the operations further comprise causing additional data to be transmitted from the circuit simulator program to the peripheral device, wherein the additional data is transmitted responsive to the circuit simulator program receiving and processing the at least a portion of the temporarily stored data.

18. The computer system of claim 13, further comprising the peripheral device, wherein the peripheral device is coupled to the peripheral connection interface, and wherein the peripheral device is configured and the electronic device is designed to receive and process data transmitted via one or more communication protocols that are operable over the peripheral connection interface.

19. The computer system of claim 13, wherein the operations further comprise modifying the received data prior to said transferring.

* * * * *

UNITED STATES PATENT AND TRADEMARK OFFICE
CERTIFICATE OF CORRECTION

| | | |
|---|---|---|
| PATENT NO. | : 8,380,481 B2 | Page 1 of 1 |
| APPLICATION NO. | : 13/487750 | |
| DATED | : February 19, 2013 | |
| INVENTOR(S) | : Zeidman | |

It is certified that error appears in the above-identified patent and that said Letters Patent is hereby corrected as shown below:

In the Specification

In Column 1, Lines 30-31, delete "computes" and insert -- computer --, therefor.

Signed and Sealed this
Eleventh Day of March, 2014

Michelle K. Lee
*Deputy Director of the United States Patent and Trademark Office*